US012745644B2

(12) United States Patent
Anderson et al.

(10) Patent No.: US 12,745,644 B2
(45) Date of Patent: Sep. 22, 2026

(54) MECHANICAL MITIGATION OF NEUTRON SEE

(71) Applicant: Rockwell Collins, Inc., Cedar Rapids, IA (US)

(72) Inventors: Eric N. Anderson, Marion, IA (US); Timothy R. Fannin, Urbana, IA (US); Brent J Nelson, Marion, IA (US); Matthew P. Corbett, Mount Vernon, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 406 days.

(21) Appl. No.: 18/243,745

(22) Filed: Sep. 8, 2023

(65) Prior Publication Data

US 2025/0087595 A1 Mar. 13, 2025

(51) Int. Cl.

| | |
|---|---|
| ***H10W 42/20*** | (2026.01) |
| ***H05K 1/181*** | (2026.01) |
| ***H10W 40/22*** | (2026.01) |
| ***H10W 70/685*** | (2026.01) |
| ***H10W 90/00*** | (2026.01) |

(52) U.S. Cl.

CPC ............ *H10W 42/20* (2026.01); *H05K 1/181* (2013.01); *H10W 40/22* (2026.01); *H10W 70/685* (2026.01); *H10W 90/00* (2026.01); *H05K 2201/0715* (2013.01); *H05K 2201/0723* (2013.01); *H10W 90/724* (2026.01); *H10W 90/734* (2026.01); *H10W 90/736* (2026.01); *H10W 90/754* (2026.01)

(58) Field of Classification Search

None

See application file for complete search history.

(56) References Cited

U.S. PATENT DOCUMENTS

| | | | | |
|---|---|---|---|---|
| 4,786,865 | A | 11/1988 | Arimura et al. | |
| 5,030,796 | A | 7/1991 | Swanson et al. | |
| 5,998,867 | A | 12/1999 | Jensen et al. | |
| 6,239,479 | B1 | 5/2001 | Hwang et al. | |
| 6,255,719 | B1 * | 7/2001 | Kuriyama | H10W 42/25 257/659 |
| 6,327,176 | B1 | 12/2001 | Li et al. | |
| 6,549,443 | B1 | 4/2003 | Jensen et al. | |
| 6,938,183 | B2 | 8/2005 | Bickel | |
| 8,460,777 | B2 | 6/2013 | Long | |

(Continued)

FOREIGN PATENT DOCUMENTS

| | | |
|---|---|---|
| EP | 2028664 A1 | 2/2009 |

OTHER PUBLICATIONS

European Search Report received in EP Application No. 24188882.5, Jan. 3, 2025, 11 pages.

(Continued)

*Primary Examiner* — Cory W Eskridge
(74) *Attorney, Agent, or Firm* — Suiter Swantz IP

(57) ABSTRACT

Neutron single effect events are mitigated using gadolinium. Layers of gadolinium are fully encapsulated as part of an airborne electronic hardware, in circuit boards, in heat sinks, and as part of the device packaging. The gadolinium layers are designed to shield semiconductor chips from neutrons. Shielding the semiconductor chips from the neutrons reduces the upset rate of device packages using the semiconductor ships.

20 Claims, 18 Drawing Sheets

100

(56) References Cited

U.S. PATENT DOCUMENTS

| | | | | |
|---|---|---|---|---|
| 8,617,913 | B2 | 12/2013 | Lower et al. | |
| 8,759,903 | B1 | 6/2014 | Liu et al. | |
| 8,884,409 | B2 | 11/2014 | Wong | |
| 9,973,515 | B1 | 5/2018 | Corbett et al. | |
| 10,262,951 | B2 | 4/2019 | Kang et al. | |
| 10,990,471 | B2 | 4/2021 | Ross | |
| 11,224,094 | B1 | 1/2022 | Corbett et al. | |
| 2006/0255299 | A1 | 11/2006 | Edwards et al. | |
| 2007/0013054 | A1 * | 1/2007 | Ruchert | H10W 40/22<br>257/E23.109 |
| 2007/0166847 | A1 | 7/2007 | Fulkerson | |
| 2007/0194256 | A1 * | 8/2007 | Srobel | G21F 1/00<br>250/515.1 |
| 2009/0068426 | A1 * | 3/2009 | Nishizawa | H01G 4/30<br>428/209 |
| 2009/0085011 | A1 | 4/2009 | Lichtenhan et al. | |
| 2010/0010692 | A1 | 1/2010 | Broderick et al. | |
| 2010/0086729 | A1 | 4/2010 | Long | |
| 2012/0187549 | A1 | 7/2012 | Lee et al. | |
| 2016/0309628 | A1 * | 10/2016 | Ghosh | C08K 3/22 |
| 2019/0221525 | A1 | 7/2019 | Lee et al. | |
| 2022/0199489 | A1 * | 6/2022 | Arrington | H01L 23/3737 |
| 2022/0384359 | A1 * | 12/2022 | Chang | H10W 40/73 |
| 2022/0392854 | A1 | 12/2022 | Ross et al. | |
| 2023/0032984 | A1 | 2/2023 | Frougier et al. | |
| 2023/0062160 | A1 * | 3/2023 | Gan | H10W 42/20 |

OTHER PUBLICATIONS

Brian Butka, et al. "Qualification of Tools for Airborne Electronic Hardware" published Jun. 1, 2014, USDOT, FAA DOT/FAA-TC-12/21.

* cited by examiner

100

102

102

MECHANICAL MITIGATION OF NEUTRON SEE

TECHNICAL FIELD

The present invention generally relates to semiconductor devices, and more specifically to protecting the semiconductor devices against radiation.

BACKGROUND

Single event effect (SEE) rates in electronic components is becoming a critical consideration for avionics system design. An SEE is caused by electron-hole pairs created by, and along the path of, an energetic particle as the energetic particle passes through a semiconductor device. Neutrons are a type of energetic particles that can affect electronic devices. Energetic neutrons are produced by nuclear reactions, collisions of protons with matter, or by interactions between cosmic rays and the earth's atmosphere. Neutrons can deeply penetrate electronic devices due to their lack of charge. The deep penetration of neutron in electronic devices cause SEE in microelectronic devices.

Thermal neutrons can play a major role in single-effect events. One reason the thermal neutrons play a role in SEE is that the flux of the thermal neutrons inside an airliner is one to two times the flux of high energy (>10 MeV) neutrons. Another reason is that for many electronic devices the SEE cross-section due to thermal neutrons is higher (by a factor of 1.5 to 3) than the SEE cross-section due to >10 MeV neutrons. The Electronics and Aviation Industry focus on mitigating the effects of neutrons has been on developing more robust physical circuit architectures and system implementations like error detection and triple mode redundancy to meet required rates.

In the field of high energy physics, project sizes and cost considerations usually favor solutions that are impractical in avionics due to size and weight considerations. System level mitigation approaches (monitors, redundancy, etc.) can substantially increase hardware, software and system design efforts. Protecting electronic devices from both thermal neutrons and higher energy neutrons would greatly reduce the potential SEE rates with corresponding reductions in design and analysis efforts. Therefore, it would be advantageous to provide a device, system, and method that cures the shortcomings described above.

SUMMARY

An airborne electronic hardware is described. The airborne electronic hardware comprises a device package. The airborne electronic hardware comprises a printed circuit board. The printed circuit board comprises a substrate. The printed circuit board comprises a conductive layer. The conductive layer is formed on the substrate. The device package is electrically coupled to the conductive layer. The printed circuit board comprises a gadolinium layer (132). The gadolinium layer (132) is over a bottom surface of the substrate. The device package is disposed above the gadolinium layer (132). The gadolinium layer (132) extends wider than the device package.

In some embodiments, the airborne electronic hardware comprises a heat sink. The heat sink comprises a base. The heat sink is coupled to the device package at the base. The heat sink comprises a plurality of fins. The plurality of fins extend upwards from the base. The heat sink comprises a gadolinium layer (114). The base encapsulates the gadolinium layer (114). The gadolinium layer (114) is disposed above the device package.

In some embodiments, the heat sink comprises a lip portion. The lip portion extends downwards from the base towards the printed circuit board. The lip portion surrounds the device package. The heat sink comprises a gadolinium layer (118). The lip portion encapsulates the gadolinium layer (118).

In some embodiments, the airborne electronic hardware comprises a gadolinium cap. The gadolinium cap is disposed above the device package. The gadolinium cap covers the device package.

In some embodiments, the device package comprises a semiconductor chip. The device package comprises a second substrate. The device package comprises a molding compound. The molding compound is formed over the semiconductor chip.

In some embodiments, the device package comprises at least one of a gadolinium layer (224), a gadolinium layer (226), or a gadolinium layer (228). The second substrate encapsulates the gadolinium layer (224). The gadolinium layer (224) is disposed below the semiconductor chip. The molding compound encapsulates the gadolinium layer (226). The gadolinium layer (226) is disposed above the semiconductor chip. The gadolinium layer (228) is a coating formed on the molding compound.

An airborne electronic hardware is described. The airborne electronic hardware comprises a device package. The airborne electronic hardware comprises a printed circuit board. The printed circuit board comprises a substrate. The printed circuit board comprises a conductive layer. The conductive layer is formed on the substrate. The device package is electrically coupled to the conductive layer. The printed circuit board comprises a gadolinium layer (120). The substrate encapsulates the gadolinium layer (120). The device package is disposed above the gadolinium layer (120). The gadolinium layer (120) extends wider than the device package.

In some embodiments, the gadolinium layer (120) extends in a two-dimensional plane within the substrate.

In some embodiments, the airborne electronic hardware comprises a heat sink. The heat sink comprises a base. The heat sink is coupled to the device package at the base. The heat sink comprises a plurality of fins. The plurality of fins extend upwards from the base The heat sink comprises a gadolinium layer (114). The base encapsulates the gadolinium layer (114). The gadolinium layer (114) is disposed above the device package.

In some embodiments, the heat sink comprises a lip portion. The lip portion extends downwards from the base towards the printed circuit board. The lip portion surrounds the device package. The heat sink comprises a gadolinium layer (118). The lip portion encapsulates the gadolinium layer (118).

In some embodiments, the airborne electronic hardware comprises a gadolinium cap. The gadolinium cap is disposed above the device package. The gadolinium cap covers the device package.

In some embodiments, the device package comprises a semiconductor chip. The device package comprises a second substrate. The device package comprises a molding compound. The molding compound is formed over the semiconductor chip.

In some embodiments, the device package comprises at least one of a gadolinium layer (224), a gadolinium layer (226), or a gadolinium layer (228). The second substrate encapsulates the gadolinium layer (224). The gadolinium layer (224) is disposed below the semiconductor chip. The molding compound encapsulates the gadolinium layer (226). The gadolinium layer (226) is disposed above the semiconductor chip. The gadolinium layer (228) is a coating formed on the molding compound.

In some embodiments, the device package comprises the gadolinium layer (226). The gadolinium layer (226) comprises a first portion, a second portion, and a third portion. The first portion extends in a two-dimensional plane within the molding compound. The second portion and the third portion each extend from the first portion.

In some embodiments, the airborne electronic hardware comprising a gadolinium layer (132). The gadolinium layer (132) is over a bottom surface of the substrate. The device package is disposed above the gadolinium layer (132). The gadolinium layer (132) extends wider than the device package.

A device package is described. The device package comprises a semiconductor chip. The device package comprises a substrate. The device package comprises a gadolinium layer (224). The substrate encapsulates the gadolinium layer (224). The gadolinium layer (224) is disposed below the semiconductor chip. The device package comprises a molding compound. The molding compound is formed over the semiconductor chip.

In some embodiments, the device package comprises a gadolinium layer (226). The molding compound encapsulates the gadolinium layer (226). The gadolinium layer (226) is disposed above the semiconductor chip.

In some embodiments, the gadolinium layer (226) comprises a first portion, a second portion, and a third portion. The first portion extends in a two-dimensional plane within the molding compound. The second portion and the third portion each extend from the first portion. The second portion and the third portion each extend from the first portion at an acute angle.

In some embodiments, the device package comprises a gadolinium layer (228). The gadolinium layer (228) is a coating formed on the molding compound.

In some embodiments, the device package is a multi-chip module device package.

BRIEF DESCRIPTION OF THE DRAWINGS

Implementations of the concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION OF THE INVENTION

Figure 1A:
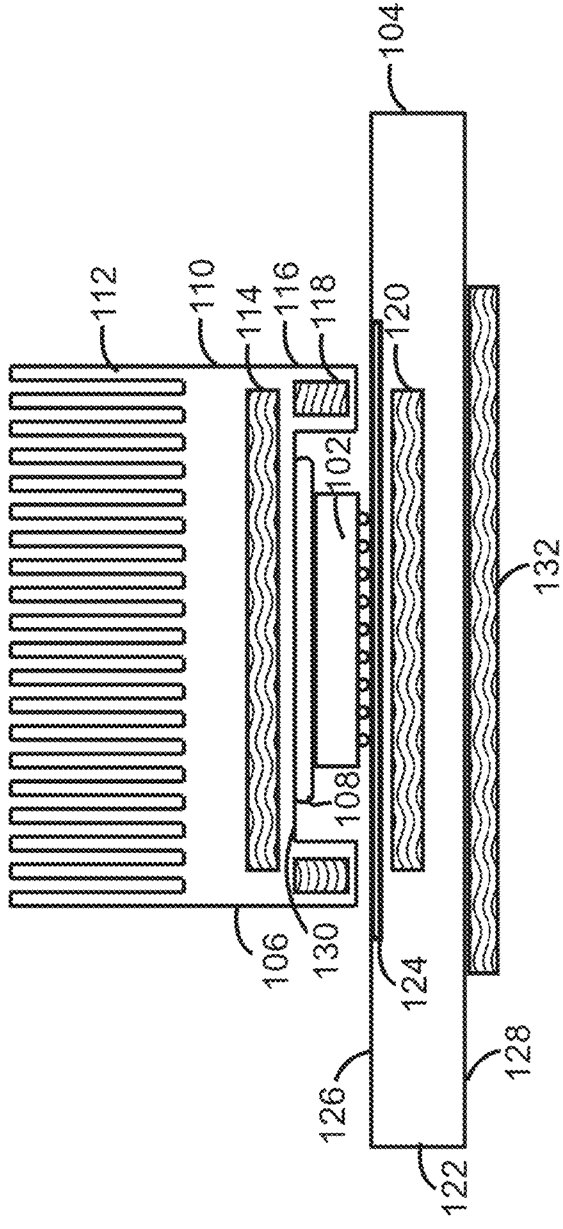
FIGS. 1A-1F depicts a cross-section view of airborne electronic hardware, in accordance with one or more embodiments of the present disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details are set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1*a*, 1*b*). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

Reference will now be made in detail to the subject matter disclosed, which is illustrated in the accompanying drawings. Embodiments of the present disclosure are generally directed to mechanically mitigating neutron single-event effects (SEE). The neutron SEE are mitigated through mechanical mitigation at a device level. The mechanical mitigation includes the absorption of low and high energy neutrons. The mechanical mitigation is designed to not significantly impact a volume or weight of the hardware.

Several approaches for inclusion of encapsulated gadolinium as a shield for sensitive devices are contemplated, including incorporation of gadolinium shields as part of the device packaging, within heat sinks, and within or near circuit boards. The neutron SEE are mitigated using gadolinium. The gadolinium layers are fully encapsulated as part of an airborne electronic hardware (AEH), in circuit boards, in heat sinks, as part of the device packaging, and the like. An "encapsulation" is an enclosure which consists of one or more layers formed on the body and in intimate contact therewith. The encapsulation hermetically seals the gadolinium layers. The gadolinium layers stops thermal neutrons.

U.S. Pat. No. 6,549,443, titled "Single event upset resistant semiconductor circuit element"; U.S. Patent Publication No. 2022/0392854, titled "Integrated circuit with intentional radiation intolerance"; U.S. Pat. No. 5,998,867, titled "Radiation enhanced chip encapsulant"; U.S. Patent Publication No. 2023/0062160, titled "Radiation protection for semiconductor devices and associated systems and methods"; U.S. Pat. No. 5,030,796, titled "Reverse-engineering resistant encapsulant for microelectric device"; U.S. Pat. No. 8,884,409, titled "Wafer backside doping for thermal neutron shielding"; U.S. Pat. No. 10,262,951, titled "Radiation hardened microelectronic chip packaging technology"; are each incorporated herein by reference in the entirety.

Gadolinium (Gd) is a rare earth element with the atomic number 64. Gadolinium is a solid at standard temperature and pressure, with a melting point in excess of 1300 C. Gadolinium has relatively low gamma emission (1440 keV).

Gadolinium may be used as a neutron barrier. Gadolinium has a neutron capture cross-section. Neutron absorption cross-section refers to a probability of interaction between a neutron and the Gadolinium. Neutron absorption cross-section may also be referred to as neutron capture cross-section. The isotope gadolinium-157 has a neutron absorption cross-section of about 250,000 barns. The neutron absorption cross-section of gadolinium is extremely high when compared with other known elements and isotopes. For example, the neutron capture cross-section of gadolinium is at least 64× boron and nearly 20× cadmium. The high neutron capture cross-section enables gadolinium to absorb neutrons. For example, gadolinium may include a penetration depth of approximately 10E-5 Meters (10 micrometers) for thermal neutrons. A 1 mm thick barrier makes appreciable differences in neutron upset rates even discounting the potential impacts of thermal neutrons. A 5.3 mm barrier of gadolinium mitigates more than 90% of higher energy level neutrons.

Gadolinium is highly reactive to water and some other chemicals. Due to the reactivity of Gadolinium, gadolinium needs to be encapsulated to protect the gadolinium from water. No special handling is required when the gadolinium is encapsulated. The encapsulation of gadolinium can be done by physical encapsulation or using gadolinium compounds. The physical encapsulation or the use of gadolinium compounds both increase the required thickness of the neutron mitigation shield. The gadolinium compounds may include any number of compounds of gadolinium and another element, For example, the gadolinium compounds may include, but are not limited to, Gadolinium(III) oxide or the like.

Gadolinium is moderately conductive. Due to the conductivity of Gadolinium, gadolinium needs to be insulated from electrical circuits. gadolinium is strongly paramagnetic or ferromagnetic through most of the avionics operating temperature range. Due to the paramagnetism, gadolinium should not be used near magnetic flux valves or strong magnetic fields.

Referring now to FIGS. 1A-1F, airborne electronic hardware 100 is described, in accordance with one or more embodiments of the present disclosure. The airborne electronic hardware 100 includes one or more of a device package 102, a printed circuit board 104 (PCB), a heat sink 106, a thermal interface material 108, gadolinium layer 132, gadolinium cap 134, and the like.

The airborne electronic hardware 100 includes the device package 102. The term "device" refers to an electric circuit element; where an electric circuit element is one of a plurality of elements formed in or on a common substrate it is referred to as a "component".

The airborne electronic hardware 100 includes the printed circuit board 104. The printed circuit board 104 includes one or more of a gadolinium layer 120, substrate 122, conductive layer 124, and the like. The printed circuit board 104 includes the substrate 122. The substrate 122 is an insulating base. The substrate 122 extends in a two-dimensional plane. The substrate 122 may be made of any insulating medium, such as, but not limited to, FR4 glass epoxy, ceramics, FR5 glass epoxy, polyimide, and the like. The substrate 122 includes a top surface 126 and a bottom surface 128.

The printed circuit board 104 includes the conductive layer 124. The conductive layer 124 is formed on the substrate. The conductive layer 124 may be formed on a top surface 126 of the substrate 122 or in a cavity recessed from the top surface 126 of the substrate 122. The conductive layer 124 may also be referred to as a conductive trace or the like. The conductive layer 124 may be formed of any conductive material used with PCBs, such as, but not limited to, copper, aluminum, and the like. The device package 102 is electrically coupled to the conductive layer 124. The substrate 122 supports the device package 102 on the conductive layer 124.

The printed circuit board 104 includes the gadolinium layer 120. The gadolinium layer 120 is formed in a layer structure within the substrate 122. The gadolinium layer 120 is disposed between the top surface 126 and the bottom surface 128. The substrate 122 encapsulates the gadolinium layer 120. The gadolinium layer 120 extends in a two-dimensional plane within the substrate 122. The gadolinium layer 120 is disposed below the conductive layer 124. The device package 102 is disposed above the gadolinium layer 120. The gadolinium layer 120 extends wider than the device package 102. The gadolinium layer 120 shields the device package 102 from neutrons travelling from the bottom surface 128 towards the device package 102.

The airborne electronic hardware 100 includes the heat sink 106. The heat sink 106 is a passive heat exchanger. The heat sink 106 is disposed above the device package 102. The heat sink 106 is coupled to the device package 102. The heat sink 106 receives heat from the device package 102. The heat sink 106 exchanges heat from the device package 102 to a fluid surrounding the heat sink 106. For example, the heat sink 106 exchanges heat from the device package 102 to air surrounding the heat sink 106. The heat sink 106 may include a base 110, fins 112, gadolinium layer 114, lip portion 116, gadolinium layer 118, and the like.

The heat sink 106 includes the base 110. The base 110 provides a foundation for coupling the device package 102 to the heat sink 106. The heat sink 106 is coupled to the device package 102 at the base 110. The base 110 then supports the heat sink 106. The heat conducts from the device package 102 to the heat sink 106 via the base 110. The base 110 receives heat from the device package 102. The base 110 includes a bottom surface 130. The device package 102 is coupled to the bottom surface of the base 110. The bottom surface 130 extends in the two-dimensional plane with the top surface 126.

The heat sink 106 includes the fins 112. The fins 112 extend upwards from the base 110. The fins 112 define one or more ducts. The ducts are configured to receive a flow of the fluid. The heat sink 106 may include any arrangement of the fins 112. For example, the arrangement of the fins 112 may include, but is not limited to, a straight-fin arrangement (as-depicted), a flared-fin arrangement, a pin-fin arrangement, or the like.

The heat sink 106 includes the gadolinium layer 114. The gadolinium layer 114 is formed in a layer structure within the base 110. The gadolinium layer 114 is disposed between the bottom surface 130 and the fins 112. The base 110 encapsulates the gadolinium layer 114. In some embodiments, the gadolinium layer 114 extends in a two-dimensional plane within the base 110. The gadolinium layer 114 is disposed above device package 102. The gadolinium layer 114 extends wider than the device package 102. The gadolinium layer 114 shields the device package 102 from neutrons travelling from the fins 112 towards the device package 102. The base 110 conducts the heat from the device package 102 through the gadolinium layer 114 to the fins 112. Gadolinium has moderate thermal conductivity (loosely equivalent to stainless steel). The gadolinium layer 114 may distribute the generated heat more evenly through the heat sink 106 instead of allowing a concentrated hot spot directly over the device package 102.

In some embodiments, the heat sink 106 includes the lip portion 116. The lip portion 116 extends downwards from the base 110. The lip portion 116 extends downwards from the bottom surface 130 of the base 110. The lip portion 116 extends downwards from the base 110 towards the printed circuit board 104. The lip portion 116 surrounds the device package 102. In some embodiments, the lip portion 116 extends orthogonal to the bottom surface 130. The lip portion 116 is separated from the top surface 126 by a gap. The gap is provided to ensure the bottom surface 130 can couple with the device package 102.

The heat sink 106 includes the gadolinium layer 118. The gadolinium layer 118 is formed in a layer structure within the lip portion 116. The lip portion 116 encapsulates the gadolinium layer 118. In some embodiments, the gadolinium layer 118 extends orthogonal with the two-dimensional plane. The gadolinium layer 118 is disposed around the device package 102. The gadolinium layer 118 shields the device package 102 from neutrons travelling in parallel with the bottom surface 130 and/or in parallel with the top surface 126. The heat sink 106, including the gadolinium layer 114 and the gadolinium layer 118, may be used in combination with the gadolinium layer 120 and/or the gadolinium layer 132 to fully shield the device package 102 from neutrons.

Although the heat sink 106 is described as including the lip portion 116 and the gadolinium layer 118, this is not intended as a limitation of the present disclosure. In some embodiments, the lip portion 116 and the gadolinium layer 118 may be a separate component from the heat sink 106. The lip portion 116 may be coupled to the printed circuit board 104 and surround the device package 102. The gadolinium layer 118 is encapsulated by the lip portion 116.

The airborne electronic hardware 100 includes a thermal interface material 108. The thermal interface material 108 interfaces between the device package 102 and the heat sink 106. The thermal interface material 108 then conducts heat form the device package 102 to the heat sink 106. The thermal interface material 108 may include a thermal paste or a thermal adhesive. The thermal interface material 108 may include any type of the thermal pastes or the thermal adhesives. The thermal interface material 108 is coupled between the device package 102 and the bottom surface 130 of the heat sink 106.

Although the airborne electronic hardware 100 is described as including the heat sink 106 and the thermal interface material 108, this is not intended as a limitation of the present disclosure. The airborne electronic hardware 100 may not require the heat sink 106 and the thermal interface material 108 depending upon the amount of heat produced by the device package 102. In some embodiments, the device package 102 does not produce sufficient heat to require the heat sink 106 and the thermal interface material 108.

In some embodiments, the airborne electronic hardware 100 includes the gadolinium layer 132. The gadolinium layer 132 is formed over the bottom surface 128 of the substrate 122. The gadolinium layer 132 extends in a two-dimensional plane. The gadolinium layer 132 is disposed below the bottom surface 128. The device package 102 is disposed above the gadolinium layer 132. The gadolinium layer 132 extends wider than the device package 102. The gadolinium layer 132 shields the device package 102 from neutrons travelling from the bottom surface 128 towards the device package 102. The gadolinium layer 132 is vertically separated from the device package 102 at a further distance than the gadolinium layer 120. To provide the same coverage of the device package 102, the gadolinium layer 132 may extend wider than the gadolinium layer 120. As the distance from the gadolinium layers to the device package increases, a large surface area of the gadolinium layer 132 is required to shield the device package 102.

In some embodiments, the airborne electronic hardware 100 includes a gadolinium cap 134. The gadolinium cap 134 is disposed above the device package 102. The gadolinium cap 134 covers the device package 102. For example, the gadolinium cap 134 covers the top and the sides of the device package 102. The gadolinium cap 134 provides shielding to the top and the sides of the device package 102. The gadolinium cap 134 may be used in combination with the gadolinium layer 120 and/or the gadolinium layer 132 to fully shield the device package 102 from neutrons. The gadolinium cap 134 may be used when the device package 102 does not produce sufficient heat to require the heat sink 106. In some embodiments, the gadolinium cap 134 is in contact with the device package 102. For example, the gadolinium cap 134 may be attached to the device package 102. In some embodiments, the gadolinium cap 134 is not in contact with the device package 102 but is proximate to the device package 102. For example, the gadolinium cap 134 may be attached to the printed circuit board 104.

Figure 1B:
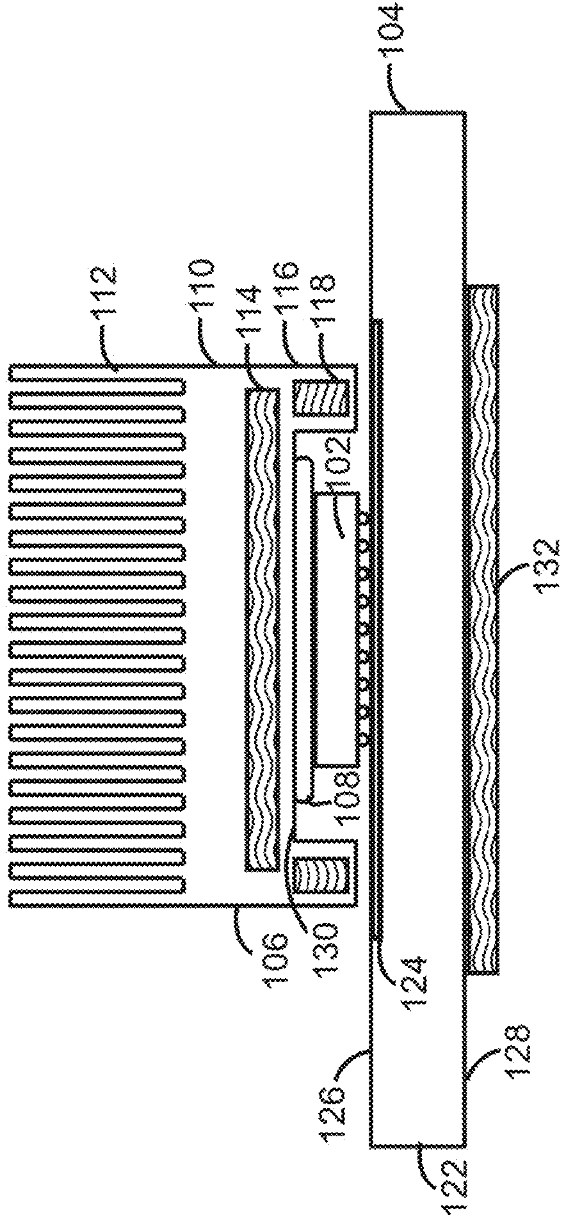
Figure 1C:
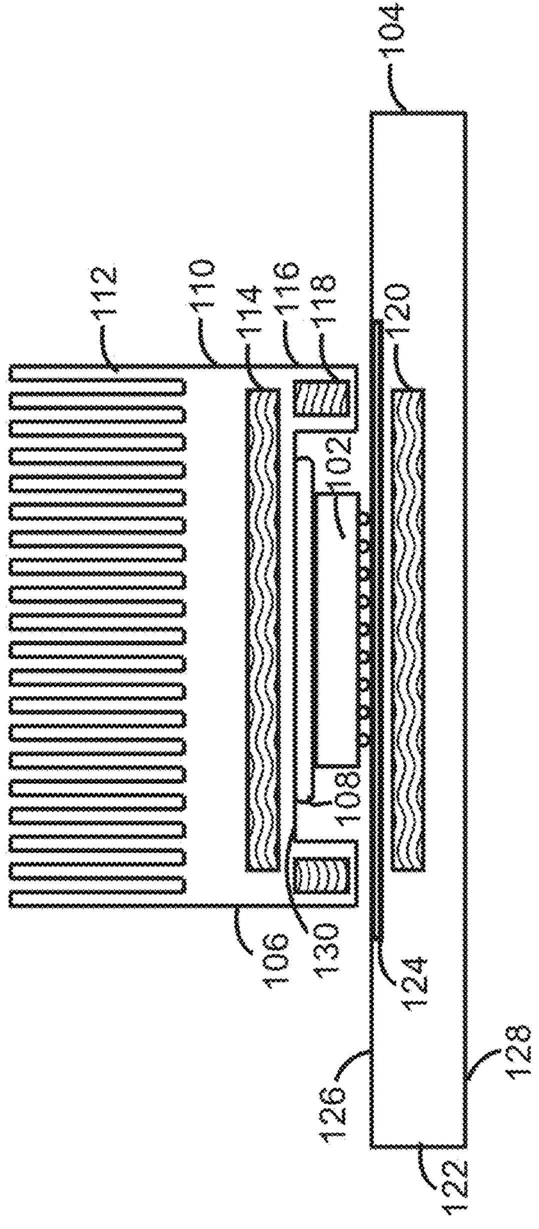
Figure 1D:
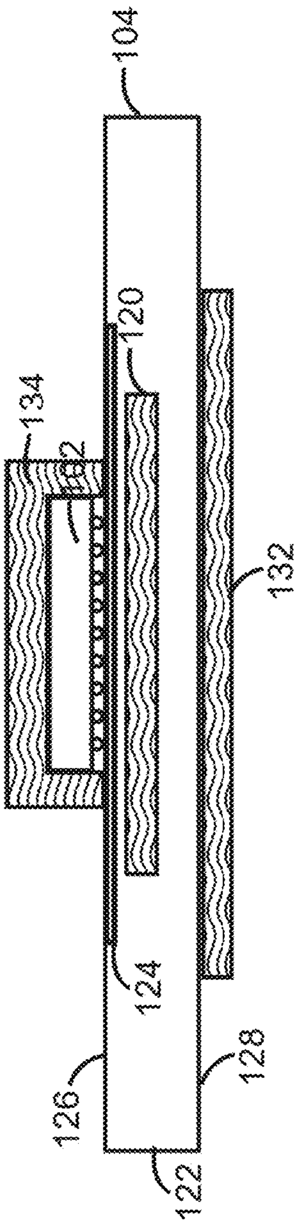
Figure 1D:
Figure 1E:
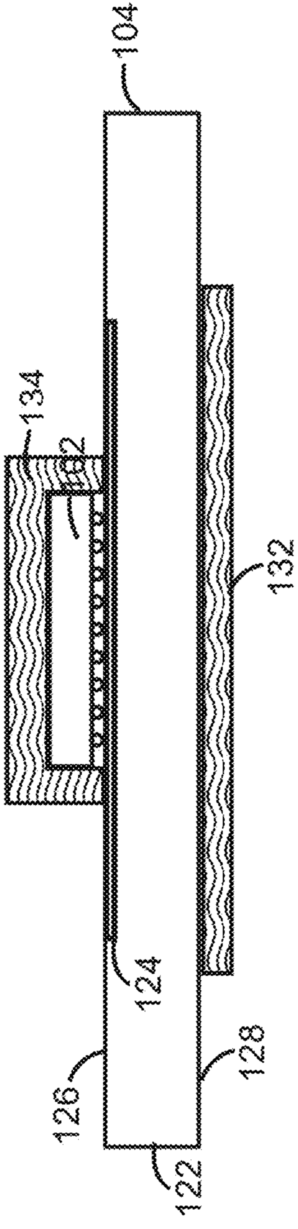
Figure 1F:
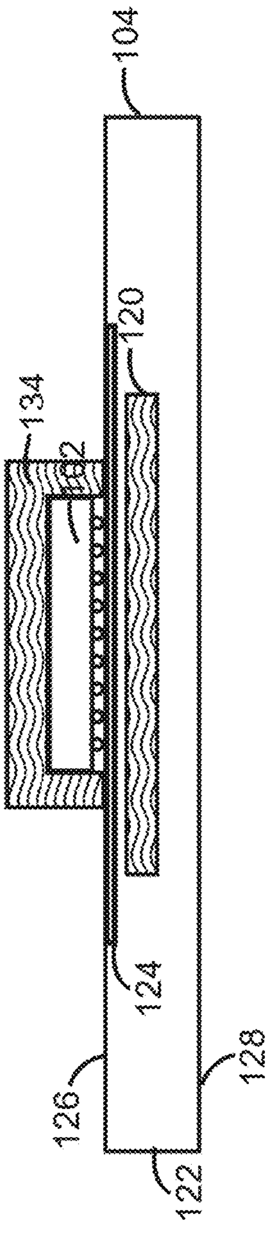

It is contemplated that the airborne electronic hardware 100 may include any permutation of the gadolinium layer 120, the gadolinium layer 132, the heat sink 106 (including the gadolinium layer 114 and/or the gadolinium layer 118), and/or the gadolinium cap 134. Various of the permutation are depicted in the figures. For example, FIG. 1A depicts the airborne electronic hardware 100 including the gadolinium layer 120, the gadolinium layer 132, the heat sink 106 (including the gadolinium layer 114 and the gadolinium layer 118). By way of another example, FIG. 1B depicts the airborne electronic hardware 100 including the gadolinium layer 132 and the heat sink 106 (including the gadolinium layer 114 and the gadolinium layer 118). By way of another example, FIG. 1C depicts the airborne electronic hardware 100 including the gadolinium layer 120 and the heat sink 106 (including the gadolinium layer 114 and the gadolinium layer 118). By way of another example, FIG. 1D depicts the airborne electronic hardware 100 including the gadolinium layer 120, the gadolinium layer 132, and the gadolinium cap 134. By way of another example, FIG. 1E depicts the airborne electronic hardware 100 including the gadolinium layer 132 and the gadolinium cap 134. By way of another example, FIG. 1F depicts the airborne electronic hardware 100 including the gadolinium layer 120 and the gadolinium cap 134.

Referring now to FIGS. 2A-2L, the device package 102 is described, in accordance with one or more embodiments of the present disclosure. The device package 102 includes one or more of a semiconductor chip 202, substrate 204, molding compound 206, traces 208, vias 210, solder masks 212, solder balls 214, wire bonds 216, die attach films 218, flip chip couplings 220, underfill 222, gadolinium layer 224, gadolinium layer 226, gadolinium layer 228, and the like.

The device package 102 includes the semiconductor chip 202. The semiconductor chip 202 may also be referred to as a die. The semiconductor chip 202 is a piece of semiconductor material having one or more active and/or one or more passive electric circuit elements. The active and/or passive electric circuit elements form an electronic circuit in the semiconductor chip 202. The electronic circuit is integrated into a body of semiconductor material of the semiconductor chip 202. In this regard, the semiconductor chip 202 includes an integrated circuit. The integrated circuit is a device where all components are built up on a common substrate and form the device including interconnections between the components.

The integrated circuit may be an analog integrated circuit, a digital integrated circuit, or an analog/digital integrated circuit. The analog integrated circuit produces analog voltages. The digital integrated circuit produces high/low voltage states. The analog/digital integrated circuit produces both analog voltages and high/low voltage states. The integrated circuit may include one or more transistors, logic gates, and the like. The transistors of the integrated circuit are susceptible to bit flipping when subject to neutrons.

The integrated circuit may function as one or more of a regulator, operational amplifier, comparator, timer, oscillator, memory, processor, binary counter, register, multiplexer, encoder, display driver, motion controller, and the like. In some embodiments, the integrated circuit may include several functions.

The device package 102 includes the substrate 204. The substrate 204 is suitable for receiving semiconductor solid-state devices, electric solid-state devices, semiconductor solid-state components, electric solid-state components, and the like. The substrate may include a wafer or the like. The substrate 204 may be a semiconductor material, such as, but not limited to, a silicon substrate or a glass substrate.

The device package 102 includes the traces 208. The traces 208 may generally include any metal, such as, but not limited to, copper, aluminum, and the like. The traces 208 may include a top trace 208*a* and/or a bottom trace 208*b*. The top trace 208*a* is disposed above the substrate 204. The bottom trace 208*b* is disposed below the substrate 204. As may be understood, the specific routing may be based on the desired circuit connection such that the various figures provided herein are not intended to be limiting. The semiconductor chip 202 is at least one of flip-chip mounted or wire-bonded to the traces 208.

The device package 102 includes the vias 210. The vias 210 couple the traces 208. Coupling by the vias 210 does not require direct connection between the vias 210 and the traces 208. For instance, the vias 210 may connect to pads. By way of another example, multiple of the vias 210 may be interconnected through traces. Connections may be made across the substrate 204 by one or more vias 210. The vias 210 may be provided to connect the printed circuit board 104 to the semiconductor chip 202. In some embodiments, the semiconductor chip 202 is electrically coupled to the printed circuit board 104. The semiconductor chip 202 is electrically coupled to the printed circuit board 104 via the traces 208, the vias 210, the solder balls 214, the wire bonds 216, and the like.

The device package 102 includes the solder mask 212. The solder mask 212 may also be referred to as a solder resist or the like. The solder mask 212 is a layer over the substrate 204 and the traces 208. The device package 102 may include a top solder mask 212*a* and a bottom solder mask 212*a*. The top solder mask 212*a* is a layer over the substrate 204 and the top traces 208*a*. The bottom solder mask 212*b* is a layer over the substrate 204 and the bottom traces 208*b*. The solder mask 212 is an electrically insulating layer of a polymer coating.

The device package 102 includes the molding compound 206. The molding compound 206 is formed over the semiconductor chip 202. The molding compound 206 is a solid construction over the semiconductor chip 202. The molding compound 206 provides a total enclosure over the semiconductor chip 202. The molding compound 206 may be formed of any molding material. The molding compound 206 may be formed of a reinforced or non-reinforced epoxy resin, an epoxy molding compound (EMC), and the like. The molding compound 206 may be applied using any process compatible with fabrication of semiconductor devices. For example, the molding compound 206 may be applied by one or more of as injection molding, transfer molding, and/or compression molding. The molding compound 206 generally protects the semiconductor chip 202. The molding compound 206 may also provide additional structural support to the semiconductor chip 202. The molding compound 206 may also hermetically seal the semiconductor chip 202. The hermetic seal may protect against environmental elements, such as temperature and moisture. The molding compound 206 may be formed over the semiconductor chip 202.

In some embodiments, the device package 102 includes the wire bonds 216 and the die attach film 218. The semiconductor chip 202 is mechanical supported on the substrate 204 by the die attach film 218. The die attach film may be an adhesive film. The semiconductor chip 202 is electrically connected to the traces 208 by the wire bonds 216.

In some embodiments, the device package 102 includes the flip chip couplings 220. The flip chip couplings 220 may refer to connecting the semiconductor chip 202 die to the trace 208 by one or more interconnects, copper pillars, and/or one or more solder joints.

The device package 102 may include any type of package, such as, but not limited to, ball grid array (BGA) packages, through hole packages (e.g., in-line packages), pin grid array packages, surface-mount packages, and the like. As depicted, the device package 102 is the BGA package. The BGA package is a surface mount device package that includes a grid of solder balls 214. In some embodiments, the device package 102 includes the solder balls 214. The solder balls 214 couple to the traces 208. The solder balls 214 couple the traces 208 to the conductive layer 124.

The device package 102 includes the gadolinium layer 224. The gadolinium layer 224 is formed in a layer structure within the substrate 204. The gadolinium layer 224 is disposed between the bottom traces 208*b* and the top traces 208*a*. The substrate 204 encapsulates the gadolinium layer 224. In some embodiments, the gadolinium layer 224 extends in a two-dimensional plane within the substrate 204. The gadolinium layer 224 is disposed below the semiconductor chip 202. The gadolinium layer 224 extends wider than the semiconductor chip 202. The gadolinium layer 244 shields the semiconductor chip 202 from neutrons travelling from the bottom traces 208*b* towards the semiconductor chip 202. The device package 102 may include multiple layers (not depicted) of the gadolinium layers 224. The vias 210 extend through the gadolinium layer 224.

In some embodiments, device package 102 includes the gadolinium layer 226. The gadolinium layer 226 is formed in a layer structure within the molding compound 206. The molding compound 206 encapsulates the gadolinium layer 226. The gadolinium layer 226 is disposed above the semiconductor chip 202. The gadolinium layer 226 extends wider than the semiconductor chip 202. The gadolinium layer 226 shields the semiconductor chip 202 from neutrons traveling from the molding compound 206 toward the semiconductor chip 202.

It is contemplated that the gadolinium layer 226 may be fabricated by performing a partial fill of the molding compound 206 to fill the layers below the gadolinium layer 226, filling the gadolinium layer 226, and filling the molding compound over the gadolinium layer 226.

In some embodiments, the gadolinium layer 226 includes a portion 230, portion 232, and portion 234. The portion 230 may be referred to as a first portion, the portion 232 may be referred to as a second portion, and the portion 234 may be referred to as a third portion. The portion 230 extends in a two-dimensional plane within the molding compound 206. The portion 232 extends from the portion 230. The portion 234 extends from the portion 230. In this regard, the portion 232 and the portion 234 each extend from the portion 230. The portion 232 may be aligned at an acute angle relative to the portion 230. The portion 234 may be aligned at an acute angle relative to the portion 230. In this regard, the portion 232 and the portion 234 each extend at an acute angle from the portion 230. Extending from the acute angle may be desirable to provide maximum shielding of the semiconductor chip 202 while minimizing the amount of the gadolinium used for the portion 232 and the portion 234. The portion 230, the portion 232, and the portion 234 may include a cross-section which defines an octagon in the shape of a hollow-trapezoid (as-depicted).

In some embodiments, device package 102 includes the gadolinium layer 228. The gadolinium layer 228 is a coating formed on the molding compound 206. A "coating" is a layer deposited on the surface of the molding compound 206. The coating is formed conformally on the surface and directly associated with the molding compound 206. The gadolinium layer 228 may also be referred to as an external cap. The gadolinium layer 228 shields the semiconductor chip 202 from neutrons traveling from the molding compound 206 toward the semiconductor chip 202. The gadolinium layer 228 may be encapsulate in a plastic film or laminated with other metallic foils.

In some embodiments, the device package 102 is a multi-chip module device package. The multi-chip module device package includes at least two of the semiconductor chips 202. The semiconductor chips 202 may be flip-chip coupled and/or wire bonded.

In some embodiments, gadolinium shielding may be applied with various geometries to address only the semiconductor chips 202 within the multi-chip module device package which are more vulnerable to neutrons. The multi-chip module device package may include layers above and below a specific of the semiconductor chips 202 and even "side walls" if the geometries allow for signal routing. The gadolinium shielding includes the gadolinium layer 224 and one of the gadolinium layer 226 or the gadolinium layer 228. The gadolinium layer 224 is disposed below a first of the semiconductor chips 202 but is not disposed below a second of the semiconductor chips 202. The gadolinium layer 226 or the gadolinium layer 228 is disposed above a first of the semiconductor chips 202 but is not disposed above a second of the semiconductor chips 202. For example, the gadolinium shielding is applied to shield the semiconductor chips 202 which function as cache dies but not shield the semiconductor chips 202 which function as processor dies.

In some embodiments, the gadolinium shielding may be applied to shield each of the semiconductor chips 202. The gadolinium shielding includes the gadolinium layer 224 and one of the gadolinium layer 226 or the gadolinium layer 228. The gadolinium layer 224 is disposed below each of the semiconductor chips 202 of the device package 102. The gadolinium layer 226 or the gadolinium layer 228 is disposed above each of the semiconductor chips 202 of the device package.

Figure 2A:
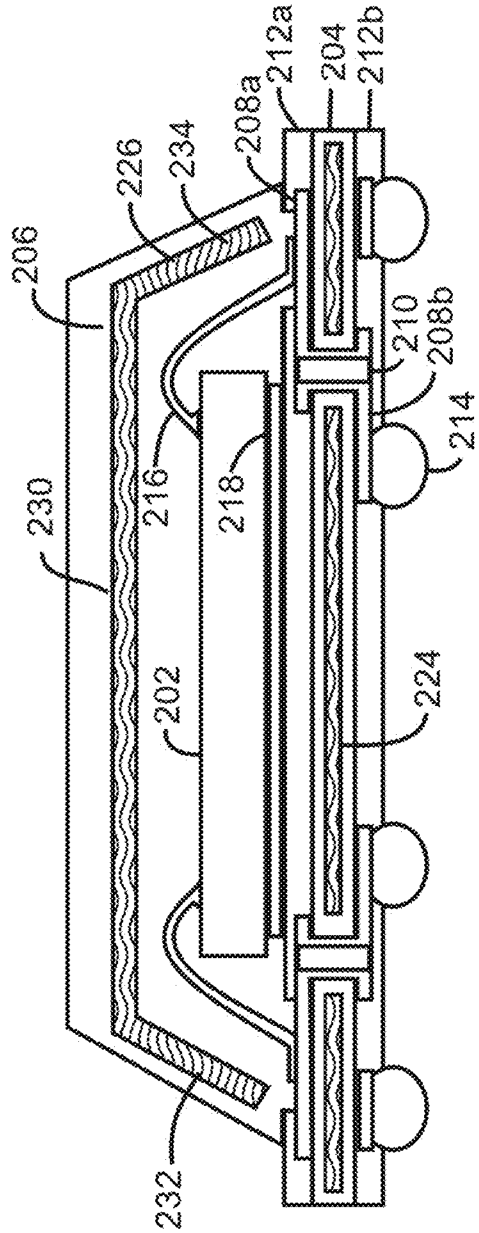
FIGS. 2A-2L depicts a cross-section view of a device package, in accordance with one or more embodiments of the present disclosure.
Figure 2B:
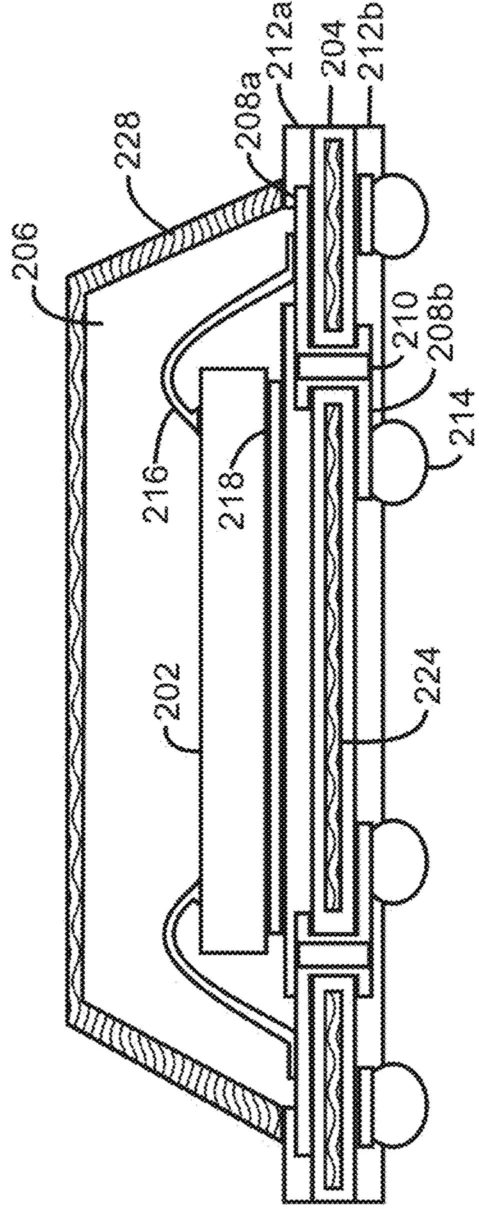
Figure 2C:
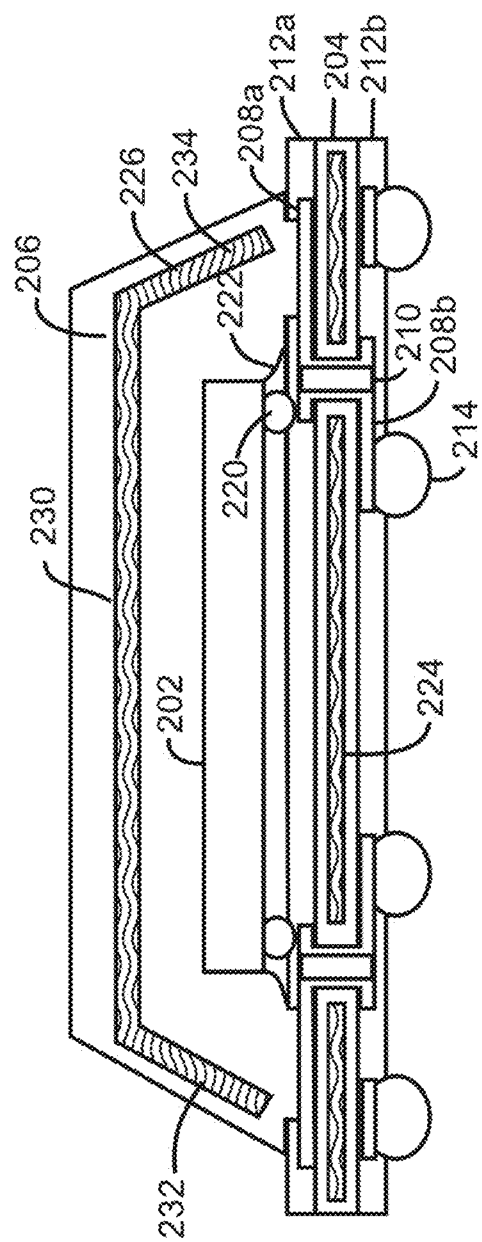
Figure 2D:
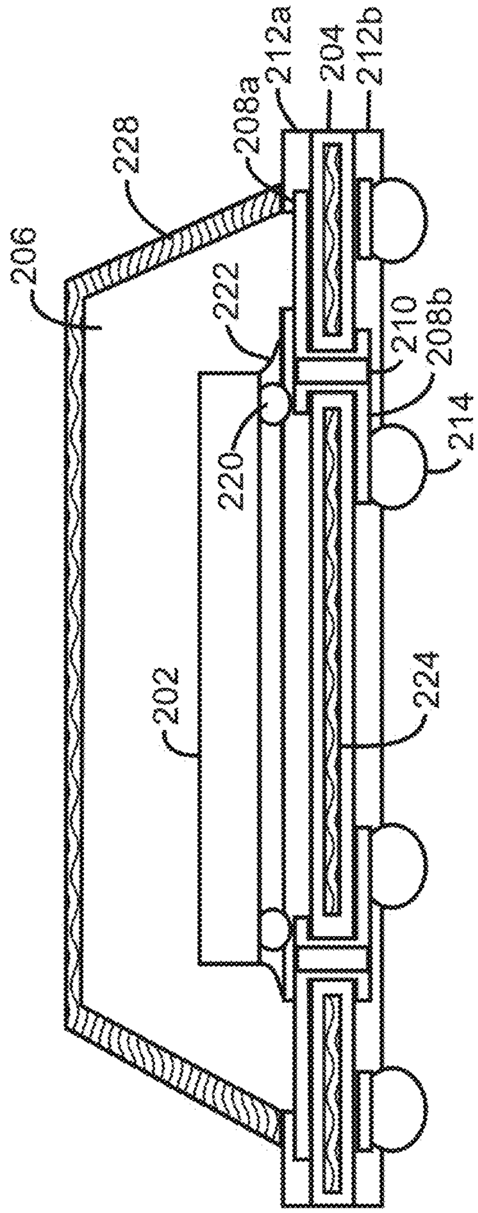
Figure 2E:
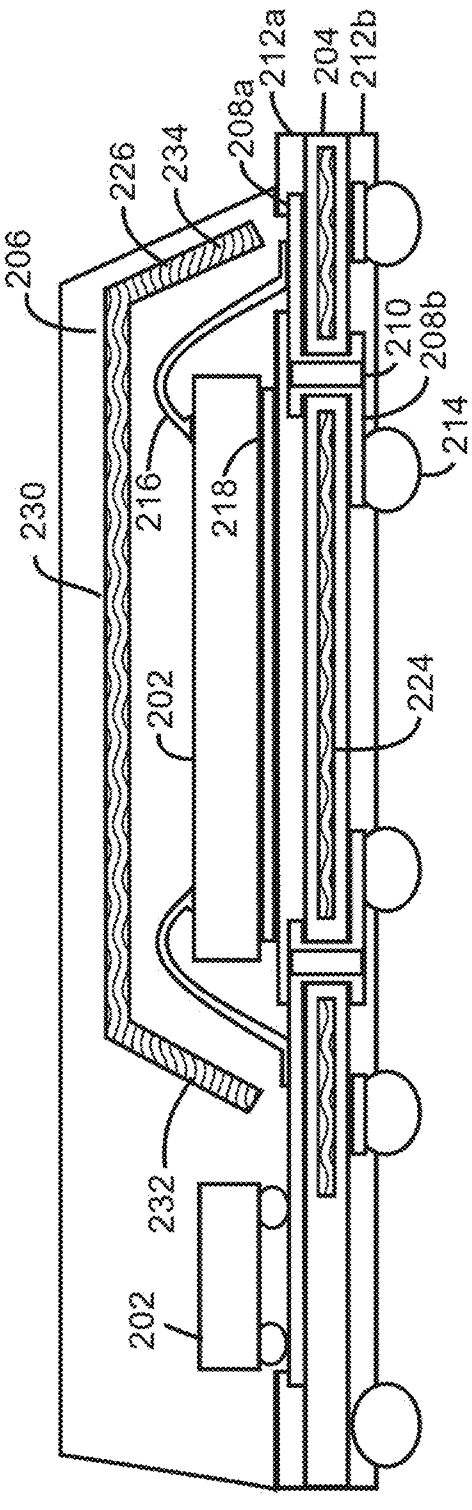
Figure 2F:
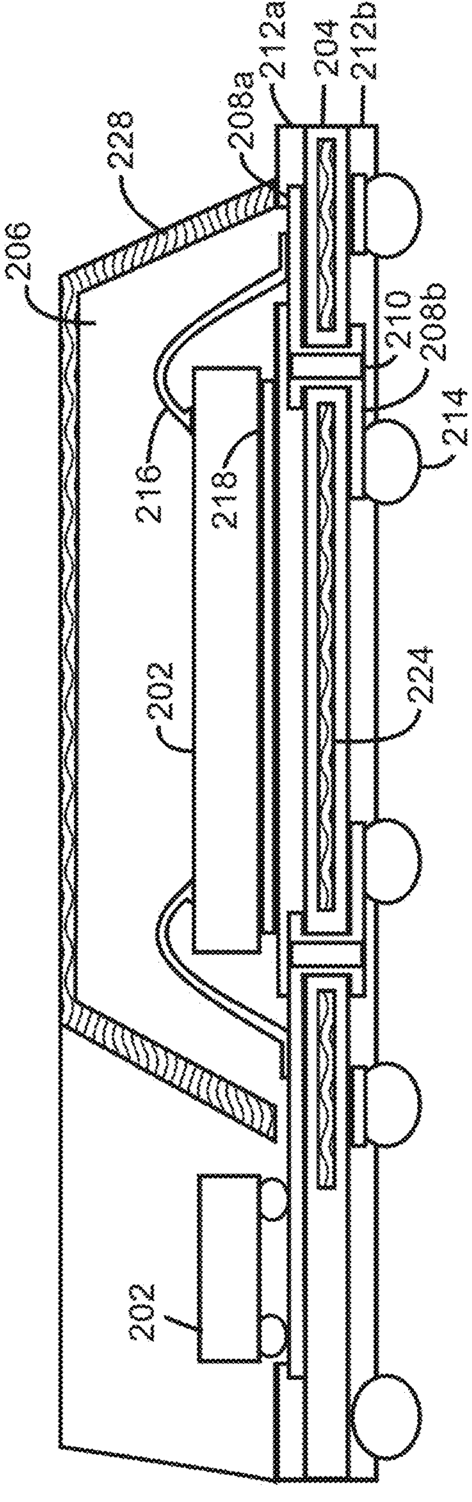
Figure 2G:
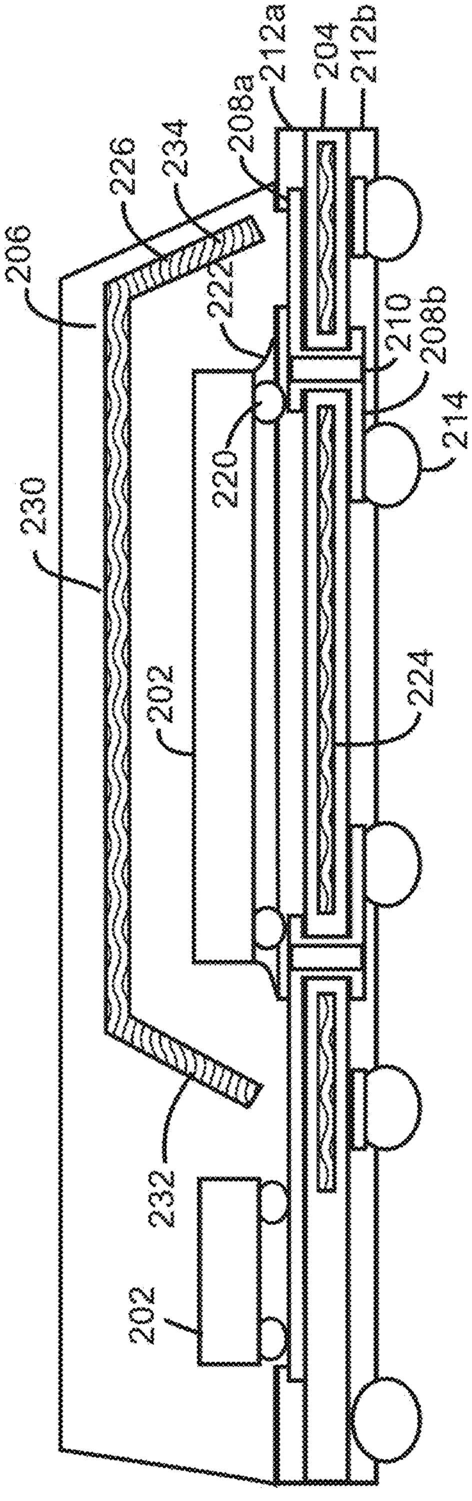
Figure 2H:
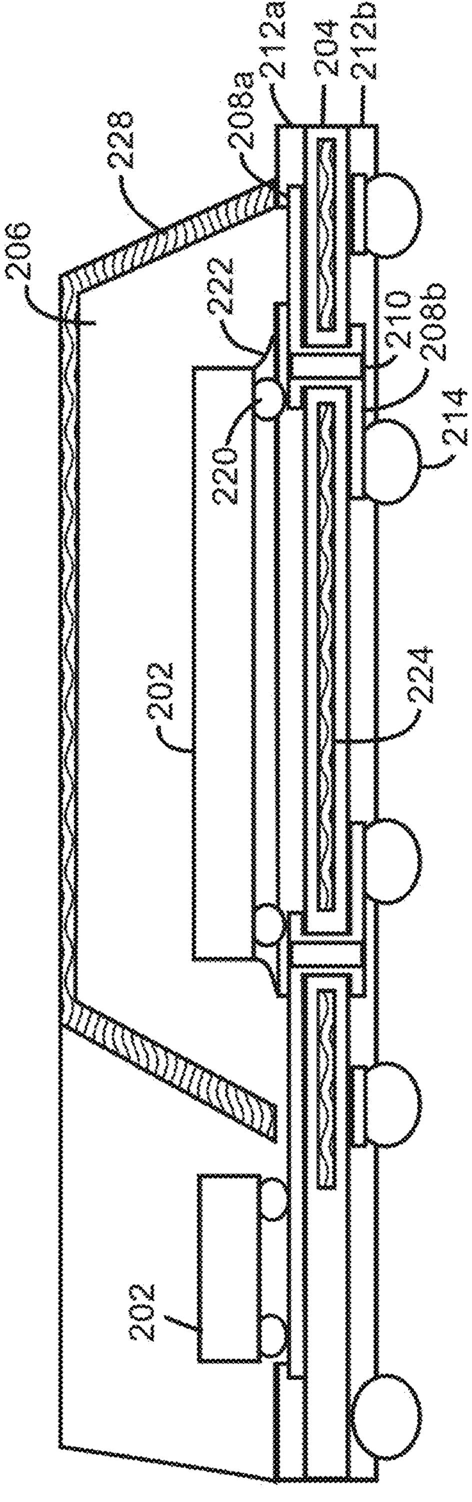
Figure 2I:
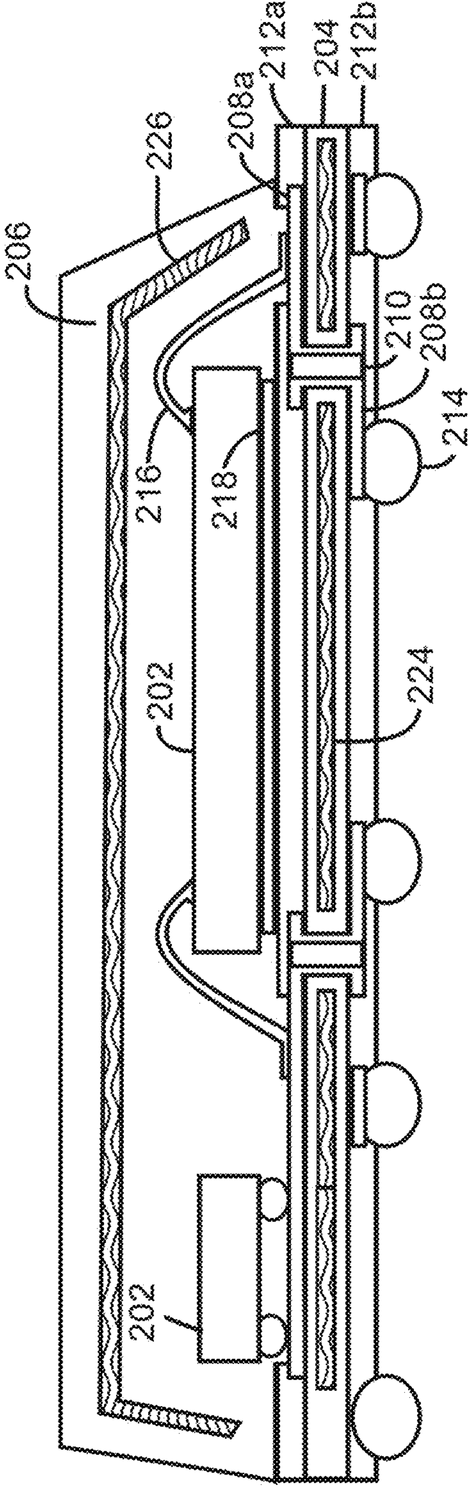
Figure 2J:
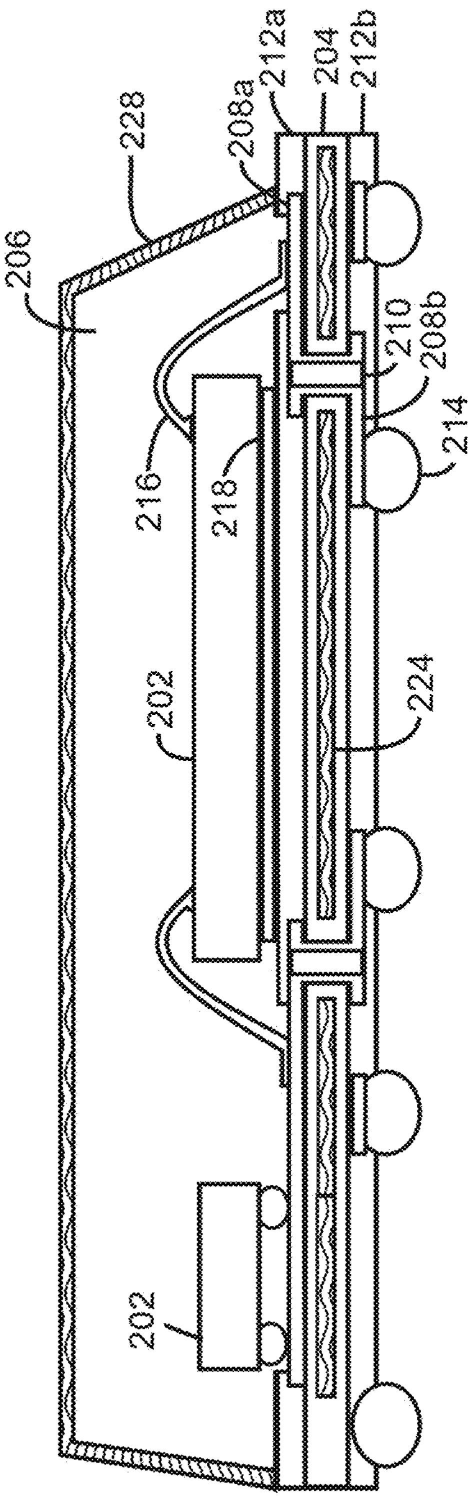
Figure 2K:
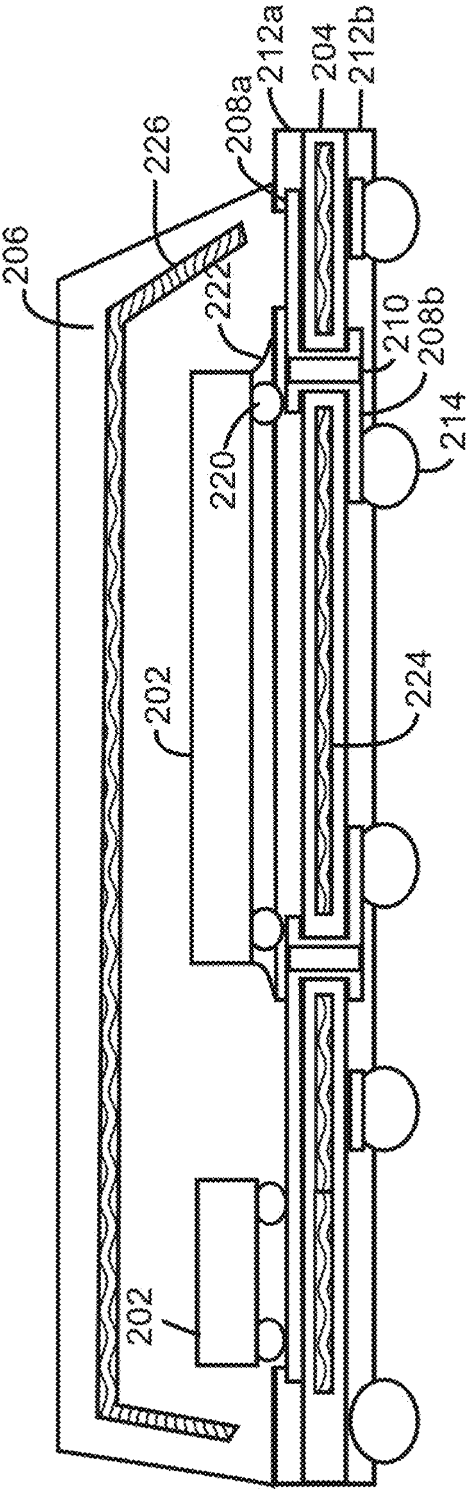
Figure 2L:
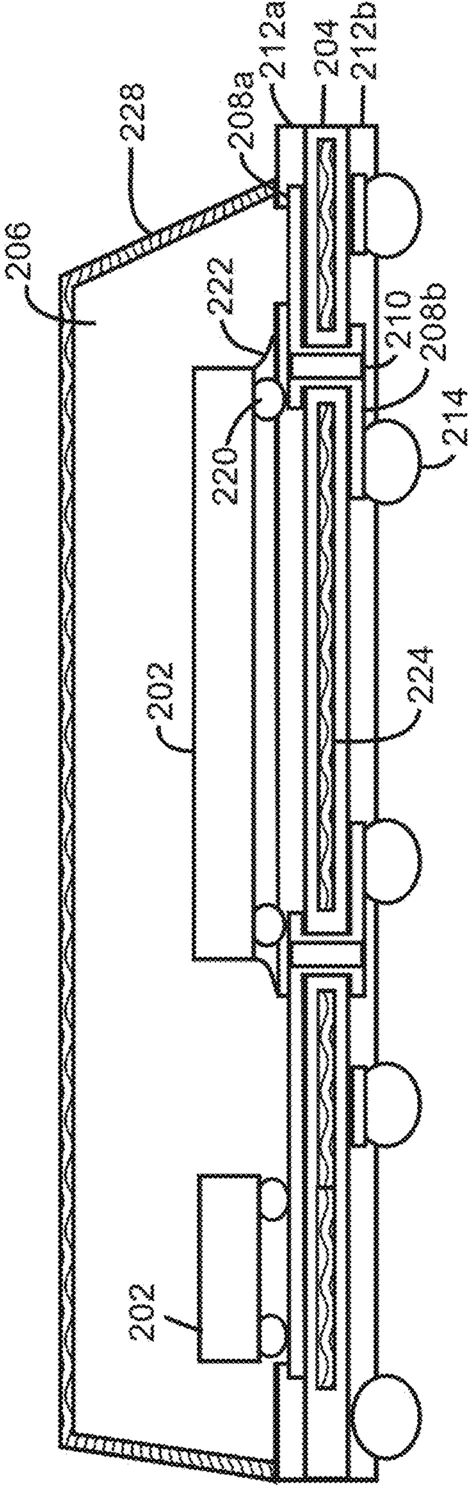

It is contemplated that the device package 102 may include any permutation of the gadolinium layer 224, the gadolinium layer 226, and/or the gadolinium layer 228 in combination with a single-chip module or a multi-chip module, where the semiconductor chips 202 are wire-bonded or flip-chip mounted. For example, FIG. 2A depicts the device package 102 including the gadolinium layer 224 and the gadolinium layer 226, in a single-chip module, where the semiconductor chip 202 is wire-bonded. By way of another example, FIG. 2B depicts the device package 102 including the gadolinium layer 224 and the gadolinium layer 228, in a single-chip module, where the semiconductor chip 202 is wire-bonded. By way of another example, FIG. 2C depicts the device package 102 including the gadolinium layer 224 and the gadolinium layer 226, in a single-chip module, where the semiconductor chip 202 is flip-chip mounted. By way of another example, FIG. 2D depicts the device package 102 including the gadolinium layer 224 and the gadolinium layer 228, in a single-chip module, where the semiconductor chip 202 is flip-chip mounted. By way of another example, FIG. 2E depicts the device package 102 including the gadolinium layer 224 and the gadolinium layer 226, in a multi-chip module, where the first semiconductor chip 202 is wire-bonded and the second semiconductor chip 202 is flip-chip mounted, and where the first semiconductor chip 202 is shielded but the second semiconductor chip 202 is unshielded. By way of another example, FIG. 2F depicts the device package 102 including the gadolinium layer 224 and the gadolinium layer 228, in a multi-chip module, where the first semiconductor chip 202 is wire-bonded and the second semiconductor chip 202 is flip-chip mounted, and where the first semiconductor chip 202 is shielded but the second semiconductor chip 202 is unshielded. By way of another example, FIG. 2G depicts the device package 102 including the gadolinium layer 224 and the gadolinium layer 226, in a multi-chip module, where both the first semiconductor chip 202 and the second semiconductor chip 202 are flip-chip mounted, and where the first semiconductor chip 202 is shielded but the second semiconductor chip 202 is unshielded. By way of another example, FIG. 2H depicts the device package 102 including the gadolinium layer 224 and the gadolinium layer 228, in a multi-chip module, where both the first semiconductor chip 202 and the second semiconductor chip 202 are flip-chip mounted, and where the first semiconductor chip 202 is shielded but the second semiconductor chip 202 is unshielded. By way of another example, FIG. 2I depicts the device package 102 including the gadolinium layer 224 and the gadolinium layer 226, in a multi-chip module, where the first semiconductor chip 202 is wire-bonded and the second semiconductor chip 202 is flip-chip mounted, and where both the first semiconductor chip 202 and the second semiconductor chip 202 are shielded. By way of another example, FIG. 2J depicts the device package 102 including the gadolinium layer 224 and the gadolinium layer 228, in a multi-chip module, where the first semiconductor chip 202 is wire-bonded and the second semiconductor chip 202 is flip-chip mounted, and where both the first semiconductor chip 202 and the second semiconductor chip 202 are shielded. By way of another example, FIG. 2K depicts the device package 102 including the gadolinium layer 224 and the gadolinium layer 226, in a multi-chip module, where both the first semiconductor chip 202 and the second semiconductor chip 202 are flip-chip mounted, and where both the first semiconductor chip 202 and the second semiconductor chip 202 are shielded. By way of another example, FIG. 2L depicts the device package 102 including the gadolinium layer 224 and the gadolinium layer 228, in a multi-chip module, where both the first semiconductor chip 202 and the second semiconductor chip 202 are flip-chip mounted, and where both the first semiconductor chip 202 and the second semiconductor chip 202 are shielded.

Referring generally again to FIGS. 1A-2L. In some embodiments, the printed circuit board 104 includes conductive layers (not depicted) formed in a layer structure within the substrate 122. Each conductive layer is formed as separate patterns or tracks.

In some embodiments, the device package 102 and the printed circuit board 104 are off-the-shelf devices which are shielded without built-in neutron shielding. For this example, the gadolinium is placed external to the device package 102 and the printed circuit board 104. In this example, the airborne electronic hardware 100 includes the gadolinium layer 132 and does not include the gadolinium layer 120. The gadolinium layer 132 is disposed below the printed circuit board 104. Since this example is a fully off the shelf device package 102 and printed circuit board 104, the only practical location for the neutron shielding on the "bottom" of the device package 102 while enabling the device package 102 to electrically couple to the conductive layer 124 would be the gadolinium layer 132. This example may be combined with one or more of the examples of the device package 102. For instance, the device package 102 may include the gadolinium layer 228. In some embodiments, the airborne electronic hardware 100 includes the gadolinium layer 132 and does not include the gadolinium layer 120, and further the device package 102 includes the gadolinium layer 228. The gadolinium layer 228 provides shielding directly on top of the device package 102 and the gadolinium layer 132 provides shielding below the device package 102.

In some embodiments, the device package 102 is an off-the-shelf device and the printed circuit board 104 is a custom PCB, with the custom PCB being shielded by built-in neutron shielding. The custom PCB may provide gadolinium shielding closer to the device package 102 by encapsulating the gadolinium layer 120 within the substrate 122. The gadolinium layer 132 may optionally be disposed below the printed circuit board 104 to provide additional shielding.

In some embodiments, the device package 102 is a custom package. The custom package includes the gadolinium layer 224, the gadolinium layer 226, and/or the gadolinium layer 228. The custom package may be used with either an off-the-shelf PCB and/or a custom PCB.

In some embodiments, the base 110, fins 112, and lip portion 116 may be made of a material. The material may be selected to achieve a desired coefficient of heat transfer for the heat sink 106. For example, the base 110, fins 112, and 116 may be made of an aluminum alloy, or the like.

In some embodiments, the device package 102 is encapsulated by gadolinium layers. In some embodiments, the gadolinium layers include gaps for a neutron to travel to the device package 102. The gaps are straight line which do not intersect with the gadolinium layer. It is contemplated that the gadolinium layers do not have to completely enclose the device package 102. Any of the various gadolinium layers may be selected with a geometry such that there are no gaps for neutrons to pass through to the device package 102 without first passing through one or more layers of the various gadolinium layers, although this may not always be achievable.

It is contemplated that the gadolinium layers may reduce the upset rate of the device package 102 by nearly a factor of 10 with only a small impact to size and weight (1 cm total thickness and approx. 79 grams). The gadolinium layer provides a relatively low cost/light weight approach to ameliorating SEE due to both low and high energy neutrons. It is contemplated that the use of gadolinium can provide significant (up to a factor of 10×) mitigation of neutron flux rate for critical avionics devices. The gadolinium layers reduces the number of neutrons travelling from a given direction.

It is contemplated that any of the various gadolinium layers described may include any surface area. For example, the surface area may include, but is not limited to, from 10 cm^2 to 1000 cm^2. It is contemplated that any of the various gadolinium layers described may include any thickness. For example, the thickness may include, but is not limited to, from 10 um to 1 mm. The gadolinium layers may be fabricated using additive manufacturing, a thin film deposition technique, or the like.

Although much of the present disclosure is described in the context of Gadolinium, this is not intended as a limitation of the present disclosure. It is contemplated that the gadolinium may be replaced with Cadmium or Samarium. Where the gadolinium is replaced with Cadmium or Samarium, the Cadmium or Samarium would require approximately 10E-4 meters of the element for absorption of thermal neutrons and appreciably greater amounts to mitigate higher energy neutrons. Therefore, the use of gadolinium is desirable for enabling a weight reduction.

The printed circuit board may include one or more metal layers separated by one or more insulating layers (not depicted). The metal layers may be formed from any electrically conductive material compatible with fabrication of printed circuit boards, such as, but not limited to, copper, gold, silver, aluminum, and the like. Similarly, the insulating layers may be formed by any electrically insulating material compatible with fabrication of printed circuit boards, such as, but not limited to, a resin material (e.g., FR-4), and the like. The metal layers may generally be fabricated by any printed circuit board fabrication process. The printed circuit board may also include multiple layers of the metal layers and the insulating layers, such that the printed circuit board may be considered a multilayer PCB.

A circuit as described herein can include one or more transistors, logic gates (e.g., NAND, AND, NOR, OR, XOR, NOT, XNOR, etc.), resistors, multiplexers, registers, capacitors, inductors, diodes, wiring, and so on), and programmable hardware devices (e.g., field programmable gate arrays, programmable array logic, programmable logic devices, processors, or the like).

It is noted herein "coupled" may mean one or more of communicatively coupled, electrically coupled, and/or physically coupled for the purposes of the present disclosure. As used herein, coupled may refer to a direct or indirect coupling. An indirect coupling may refer to a connection via another function element. A direct coupling may refer to a connection without intermediary functional elements. It is noted herein that by being "coupled between", it may be understood to be relative to movement or flow of a signal between two or more components, and may additionally include intervening components therein. An electrical coupling or electrical connection may refer to the ability of electrical energy to flow between components. The terms electrical coupling and electrical connection may be used interchangeably. An interconnection refers to the arrangement of conductive and insulating regions electrically connecting the respective electrodes of at least two components. A mechanical coupling or mechanical attachment may refer to a physical support of components. The terms mechanical coupling and mechanical attachment may be used interchangeably. In some instances, the mechanical attachment is provided to support the component while a molding compound is formed over, around, and/or under the component. Once the molding compound is set, the molding compound in combination with the mechanical attachment may provide a desired level of a rigidity to the component.

The methods, operations, and/or functionality disclosed may be implemented as sets of instructions or software readable by a device. The steps may include computations which may be performed simultaneously, in parallel, or sequentially. Further, it is understood that the specific order or hierarchy of steps in the methods, operations, and/or functionality disclosed are examples of exemplary approaches. Based upon design preferences, it is understood that the specific order or hierarchy of steps in the methods, operations, and/or functionality can be rearranged while remaining within the scope of the inventive concepts disclosed herein. The accompanying claims may present elements of the various steps in a sample order, and are not necessarily meant to be limited to the specific order or hierarchy presented. It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mixable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed:

1. An airborne electronic hardware comprising:

a device package;

a printed circuit board comprising:

a substrate;

a conductive layer; wherein the conductive layer is formed on the substrate; wherein the device package is electrically coupled to the conductive layer; and a gadolinium layer (132); wherein the gadolinium layer (132) is over a bottom surface of the substrate; wherein the device package is disposed above the gadolinium layer (132); wherein the gadolinium layer (132) extends wider than the device package; and a heat sink comprising:

a base; wherein the heat sink is coupled to the device package at the base;

a plurality of fins; wherein the plurality of fins extend upwards from the base; and a gadolinium layer (114); wherein the base encapsulates the gadolinium layer (114); wherein the gadolinium layer (114) is disposed above the device package.

2. The airborne electronic hardware of claim 1, wherein the device package is coupled to a bottom surface of the base, wherein the base is separated from the substrate, wherein the device package is separated from the gadolinium layer (114) by the bottom surface of the base, wherein the base hermetically seals the gadolinium layer (114) by encapsulating the gadolinium layer (114).

3. The airborne electronic hardware of claim 1, the heat sink comprising:

a lip portion; wherein the lip portion extends downwards from the base towards the printed circuit board; wherein the lip portion surrounds the device package; wherein the lip portion is separated from the substrate by a gap; and a gadolinium layer (118); wherein the lip portion encapsulates the gadolinium layer (118).

4. The airborne electronic hardware of claim 1, wherein the gadolinium layer (132) and the gadolinium layer (114) comprise Gadolinium (III) oxide, wherein the base and the plurality of fins comprise an aluminum alloy.

5. The airborne electronic hardware of claim 1, wherein the device package comprises:

a semiconductor chip;

a second substrate; and a molding compound; wherein the molding compound is formed over and onto the semiconductor chip.

6. The airborne electronic hardware of claim 5, wherein the device package comprises at least one of:

a gadolinium layer (224); wherein the second substrate encapsulates the gadolinium layer (224); wherein the gadolinium layer (224) is disposed below the semiconductor chip;

a gadolinium layer (226); wherein the molding compound encapsulates the gadolinium layer (226); wherein the gadolinium layer (226) is disposed above the semiconductor chip; or a gadolinium layer (228); wherein the gadolinium layer (228) is a coating formed on the molding compound.

7. An airborne electronic hardware comprising:

a device package;

a printed circuit board comprising:

a substrate;

a conductive layer; wherein the conductive layer is formed on the substrate; wherein the device package is electrically coupled to the conductive layer; and a gadolinium layer (120); wherein the substrate encapsulates the gadolinium layer (120); wherein the device package is disposed above the gadolinium layer (120); wherein the gadolinium layer (120) extends wider than the device package; and a heat sink comprising:

a base; wherein the heat sink is coupled to the device package at the base;

a plurality of fins; wherein the plurality of fins extend upwards from the base; and a gadolinium layer (114); wherein the base encapsulates the gadolinium layer (114); wherein the gadolinium layer (114) is disposed above the device package.

8. The airborne electronic hardware of claim 7, wherein the gadolinium layer (120) extends in a two-dimensional plane within the substrate.

9. The airborne electronic hardware of claim 7, wherein the device package is coupled to a bottom surface of the base, wherein the base is separated from the substrate, wherein the device package is separated from the gadolinium layer (114) by the bottom surface of the base, wherein the base hermetically seals the gadolinium layer (114) by encapsulating the gadolinium layer (114).

10. The airborne electronic hardware of claim 7, the heat sink comprising:

a lip portion; wherein the lip portion extends downwards from the base towards the printed circuit board; wherein the lip portion surrounds the device package; wherein the lip portion is separated from the substrate by a gap; and a gadolinium layer (118); wherein the lip portion encapsulates the gadolinium layer (118).

11. The airborne electronic hardware of claim 7, wherein the gadolinium layer (132) and the gadolinium layer (114)

comprise Gadolinium (III) oxide, wherein the base and the plurality of fins comprise an aluminum alloy.

12. The airborne electronic hardware of claim 7, wherein the device package comprises:

a semiconductor chip;

a second substrate; and a molding compound; wherein the molding compound is formed over and onto the semiconductor chip.

13. The airborne electronic hardware of claim 12, wherein the device package comprises at least one of:

a gadolinium layer (224); wherein the second substrate encapsulates the gadolinium layer (224); wherein the gadolinium layer (224) is disposed below the semiconductor chip;

a gadolinium layer (226); wherein the molding compound encapsulates the gadolinium layer (226); wherein the gadolinium layer (226) is disposed above the semiconductor chip; or a gadolinium layer (228); wherein the gadolinium layer (228) is a coating formed on the molding compound.

14. The airborne electronic hardware of claim 12, wherein the device package comprises the gadolinium layer (226); wherein the gadolinium layer (226) comprises a first portion, a second portion, and a third portion; wherein the first portion extends in a two-dimensional plane within the molding compound; wherein the second portion and the third portion each extend from the first portion.

15. The airborne electronic hardware of claim 7, comprising a gadolinium layer (132); wherein the gadolinium layer (132) is over a bottom surface of the substrate; wherein the device package is disposed above the gadolinium layer (132); wherein the gadolinium layer (132) extends wider than the device package.

16. A device package comprising:

a semiconductor chip;

a substrate;

a gadolinium layer (224); wherein the substrate encapsulates the gadolinium layer (224); wherein the gadolinium layer (224) is disposed below the semiconductor chip; and a molding compound; wherein the molding compound is formed over and onto the semiconductor chip.

17. The device package of claim 16, comprising a gadolinium layer (226); wherein the molding compound encapsulates the gadolinium layer (226); wherein the gadolinium layer (226) is disposed above the semiconductor chip.

18. The device package of claim 17, wherein the gadolinium layer (226) comprises a first portion, a second portion, and a third portion; wherein the first portion extends in a two-dimensional plane within the molding compound; wherein the second portion and the third portion each extend from the first portion; wherein the second portion and the third portion each extend from the first portion at an acute angle, wherein the semiconductor chip is disposed between the second portion and the third portion.

19. The device package of claim 18, wherein the device package is a multi-chip module device package, wherein the semiconductor chip is a first semiconductor chip, the device package comprising a second semiconductor chip, wherein the molding compound is formed over and onto the second semiconductor chip, wherein the second portion of the gadolinium layer (226) is disposed between the first semiconductor chip and the second semiconductor chip such that the second semiconductor chip is unshielded by the gadolinium layer (226).

20. The device package of claim 18, wherein the device package is a multi-chip module device package, wherein the semiconductor chip is a first semiconductor chip, the device package comprising a second semiconductor chip, wherein the molding compound is formed over and onto the second semiconductor chip, wherein the second semiconductor chip is disposed between the second portion and the third portion such that the second semiconductor chip is shielded by the gadolinium layer (226).

* * * * *